United States Patent
Benwadih et al.

(10) Patent No.: US 8,951,458 B2
(45) Date of Patent: Feb. 10, 2015

(54) PRODUCING A DEFORMABLE SYSTEM WITH A VIEW TO DISPLACING AN OBJECT ENCLOSED IN THE LATTER

(75) Inventors: Mohammed Benwadih, Champigny sur Marne (FR); Jacqueline Bablet, Le Gua (FR); Philippe Coronel, Barraux (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 488 days.

(21) Appl. No.: 13/220,288

(22) Filed: Aug. 29, 2011

(65) Prior Publication Data
US 2012/0079709 A1    Apr. 5, 2012

(30) Foreign Application Priority Data
Sep. 30, 2010 (FR) ..................................... 10 57913

(51) Int. Cl.
*B29C 39/10* (2006.01)
(52) U.S. Cl.
USPC . 264/263; 264/275; 264/272.21; 264/272.15; 264/279.1
(58) Field of Classification Search
None
See application file for complete search history.

(56) References Cited

U.S. PATENT DOCUMENTS

| 2,480,750 | A | * | 8/1949 | Leary ........................... 264/437 |
| 5,463,233 | A | | 10/1995 | Norling |

FOREIGN PATENT DOCUMENTS

| EP | 2014611 A2 | 1/2009 |
| EP | 2105940 A1 | 9/2009 |
| JP | 59-230714 | * 12/1984 |

OTHER PUBLICATIONS

Republique Francaise, Rapport De Recherche Preliminaire International Search Report, dated Jun. 8, 2011, 2 pgs.

* cited by examiner

*Primary Examiner* — Edmund H. Lee
(74) *Attorney, Agent, or Firm* — Harris Beach PLLC

(57) ABSTRACT

The invention relates to a method for displacing an object in a solid system involving the following steps: placing the object in a matrix which is solid at a first temperature and capable of softening due to the effect of a temperature increase; if necessary, increasing the temperature until the matrix softens; applying an external action to the object so as to move it inside the matrix; lowering the temperature until the matrix solidifies.

14 Claims, 3 Drawing Sheets

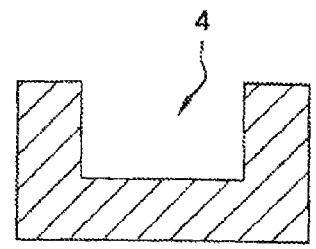
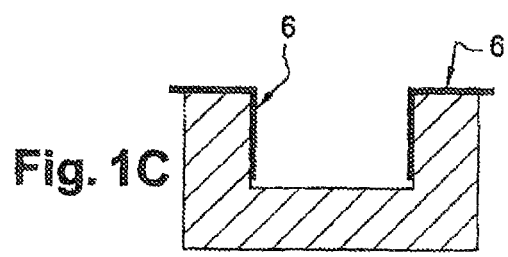
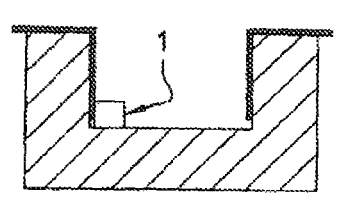
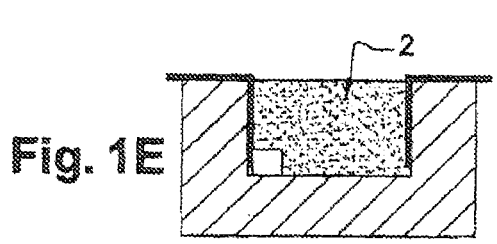
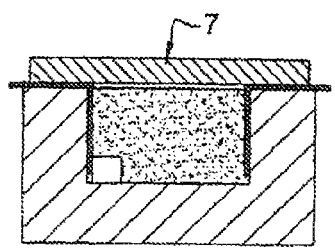
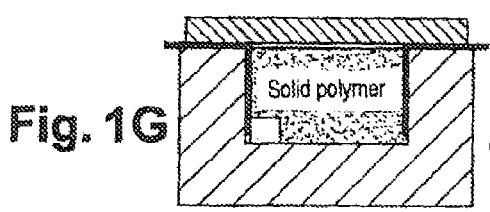
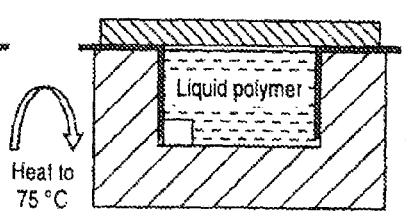
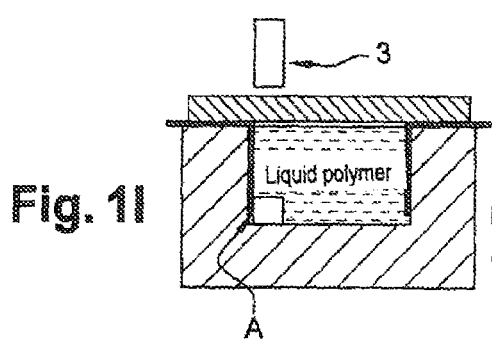
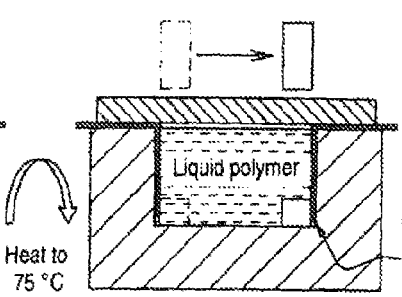

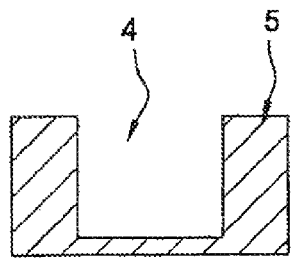
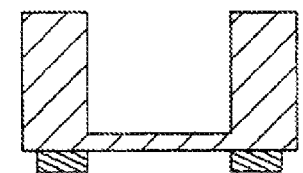
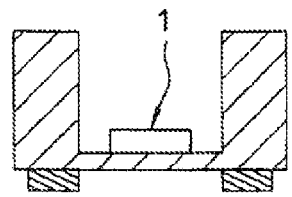
Fig. 2A  Fig. 2B  Fig. 2C
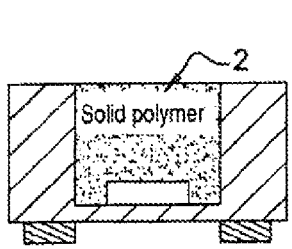
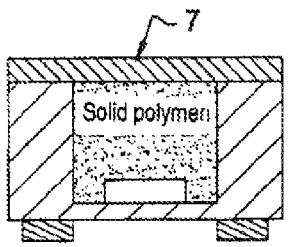
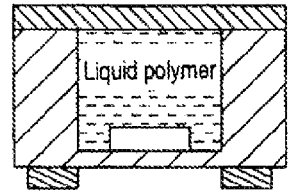
Fig. 2D  Fig. 2E  Fig. 2F
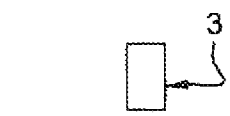
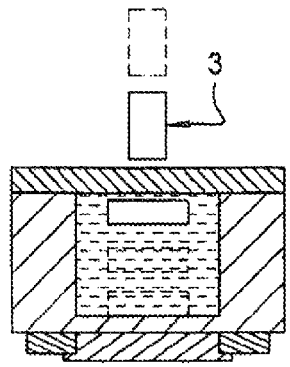
Fig. 2G — Modification of thickness of dielectric in three dimensions / Modification of electrical performance of transistor
Fig. 2H
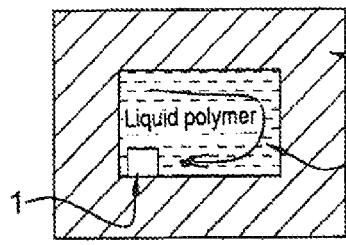
Fig. 2I

PRODUCING A DEFORMABLE SYSTEM WITH A VIEW TO DISPLACING AN OBJECT ENCLOSED IN THE LATTER

CROSS REFERENCE TO RELATED APPLICATION

This application claims benefit of French Patent Application No. 1057913, filed on Sep. 30, 2010. The entirety of this application is incorporated herein by reference.

FIELD OF THE INVENTION

The present invention proposes a method that makes it possible to displace an object that is placed in a solid system. This method involves temporarily softening the medium in which the object is placed and then moving the object by applying an action or an external force.

Advantageously, the present invention has applications in the field of electronics, for example producing variable connections or fabricating variable-capacitance transistors.

DESCRIPTION OF PRIOR ART

Solid devices that contain several components have the drawback of being fixed insofar as the relative position of their various components is fixed.

The attraction of making these devices more flexible is obvious, especially in the field of electronics.

This way, a single battery in a system would be able to establish several connection points, thus making it possible to power several objects located in different locations, if its displacement were made possible.

In the context of organic field-effect transistors, it is known that capacitance depends on the gate-oxide distance. Thus, the possibility of modifying this distance by moving the gate would make it possible to obtain transistors with variable capacitance.

There is therefore a real need to develop technical solutions in order to move an object or component within a solid system or device.

SUMMARY OF THE INVENTION

The present invention is based on using materials, especially polymers, that have a low melting temperature (Tf) and/or a low glass transition temperature (Tg) as a matrix in order to insert an object with a view to displacing it by altering the solid/liquid temperature of this matrix.

More precisely, the present method relates to a method for displacing an object inside a solid system which involves the following steps:
  placing the object in a matrix, said matrix being solid at a first temperature and capable of softening due to the effect of a temperature increase;
  if necessary, increasing the temperature until the matrix softens;
  applying an external action to the object so as to move it inside the softened matrix;
  lowering the temperature until the matrix solidifies.

As stated above, the present invention advantageously has applications in the field of electronics and even microelectronics. The objects in question are, for example, silicon nano-wires, carbon nanotubes, micro batteries, micro-cells, connectors, optical lenses, transistor electrodes or optical filters. In this context, the object advantageously consists of a conductive material.

It is apparent that the matrix is temporarily softened in order to allow movement of the object then, after displacement, solidifies again in order to fix the system.

Within the scope of the invention, the matrix does not necessarily have any functionality in the solid system other than that of allowing displacement of the object. Advantageously and in practice, this means that:
  the object is embedded in said matrix;
  the matrix has the necessary volume required to allow displacement.

On the other hand and advantageously, one functional element of the solid system, other than the object, is a substrate. In one preferred embodiment, the object is therefore placed in a cavity provided in a substrate and then covered or buried in the matrix which, at this stage, can be in a solid or liquid form.

In this way and preferably, the matrix will fill the entire cavity. In other words, the volume of the matrix corresponds to the volume of the cavity less the volume of the object.

Because of this, the cavity has variable dimensions, depending on the displacement and size of the object that is to be moved. Thus, by way of example:
  If the object is a micro battery intended to power two objects in different locations, the cavity will have dimensions roughly equal to a displacement of 500 µm to 10 mm, or even 50 mm;
  If the object is a silicon nano-wire intended to act as a floating gate in order to connect or form a short-circuit, the displacement can be of the order of 1 µm to 100 µm.

It is apparent that, for such a system to function, there are a number of constraints in terms of temperature as far as the nature of the materials used is concerned:
  the entire system must be solid at the temperature of interest, generally the operating temperature, which advantageously corresponds to ambient temperature (20 to 30° C.);
  at the softening temperature of the matrix, the object, but also the other components of the solid system and especially the substrate, must remain functional and, in particular, in a solid state.

In practice, the matrix must therefore not have a particularly high softening temperature. Materials that are especially suitable for making the matrix according to the invention are materials classified as polymers.

Polymers include several classes including polyesters, polyamides, acrylics, styrenics, polyurethanes and polyimides.

Examples of preferred materials in the context of the invention are as follows:
  Ethylene and methyl acrylate copolymers which have a melting temperature lower than 95° C., or
  Ethylene and vinyl acetate copolymers which have a melting temperature lower than 75° C.
  Obviously, these can also be used in a mixture.

Any other polymer not having a particularly high melting temperature, advantageously lower than 200° C., can be used, as can materials whose solid-liquid transition takes place between −50° C. and 200° C.-water for example.

In the context of the invention, the term "softening temperature" is taken to be the temperature at which the material in question changes from the solid state and tends to become liquid. In practice, this temperature corresponds to the melting temperature (Tf) and/or glass transition temperature (Tg).

The reader is reminded that both these temperatures can affect the physical state of a material:
  the glass transition temperature (Tg) separates glassy behavior at T<Tg(solid) from the rubber-like or elastomer state at T>Tg(liquid). This temperature extends over a considerable range in the case of polymers;

the melting temperature (Tf) and its opposite, the crystallization temperature. Obviously, these temperatures are only meaningful if the material in question is capable of crystallizing.

Glass transition is an important phenomenon which affects the physical behavior of non-crystalline systems as a function of their temperature. It actually denotes transition from behaving like a solid (glass) to behaving like a liquid.

Factors that influence temperature Tg are well-known to those skilled in the art and are, for example, the rigidity of the macromolecular chain, inter-chain interactions, the overall size or flexibility of lateral groups and molar mass.

Also, these two temperatures Tg and Tf may be correlated in cases where the polymer in question is crystallizable. The chemical factors that control temperature Tg also have an effect on temperature Tf because both these temperatures are essentially controlled by the rigidity of the macromolecular chains.

As stated above, the softening temperature (Tg or Tf) of the matrix must, in particular, be lower than that of the substrate. In practice, the material from which the substrate is made is advantageously a plastic, even more advantageously polyethylene naphthalate (PEN) or the polyimide-based material that is used to make printed circuit boards (PCBs). In fact, PEN has a glass transition temperature (Tg) of around 120° C. and a melting temperature (Tf) in excess of 250° C.

Preferably and according to the invention, in order to make the system thermally stable, the matrix (advantageously polymer)/substrate (advantageously plastic) pair is selected so that the difference between their glass transition temperature (Tg) and/or melting temperature (Tf) is equal to or greater than 50° C. or, even more advantageously, 70 to 100° C.

To complete the system, a film or plastic membrane-type layer can be used to partially or wholly cover or encapsulate the matrix and/or the substrate. This layer can thus be applied on top of the cavity filled with matrix using any conventional technique such as bonding. The nature of this layer or membrane is chosen so that it does not obstruct the external action that is used to displace the object.

As stated above, displacement of the object is obtained by applying an external action. This can be an electrical action (by electrophoresis or by applying an electric field), a magnetic action (applied by using a magnet) or a mechanical action (for example by using gravity to flip the system).

Using a magnet is a preferred embodiment according to the invention. Depending on the strength of said magnet and the viscosity of the matrix, it is thus possible to vary the displacement of the object.

The object must, obviously, be capable of being displaced by the applied action. It may therefore be necessary to cover it, at least partially, in a layer or coating that makes it magnetic or electrically conductive for example.

The object can be displaced in the matrix in three dimensions, for instance in a vertical or horizontal plane relative to the surface of the substrate.

Once the desired displacement has been obtained, the temperature of the system is lowered so that the matrix becomes solid again and the system is fixed. Nevertheless, it is possible to subject this same system to this thermal cycling again whenever there is a need to displace the object.

As mentioned above, the present invention is especially useful in the field of electronics. Because of this and according to another aspect of the invention, the invention relates to an electronic device comprising an object capable of being displaced by using the method described above.

More precisely, the present invention has two particularly appropriate applications.

According to a first aspect, the invention proposes a method for establishing configurable connections between an object, advantageously a micro battery, and two feed points (A, B) of a solid system that involves moving the object between points A and B located in the cavity of the substrate by using the claimed method. In order for electrical connection to be effective, the connection lines must pass through said points A and B. In one preferred embodiment, the walls of the cavity are therefore covered, at least at the level of points A and B, in an electrically conductive layer that allows the supply of power.

In other words, the invention relates to a method for establishing connections between an object, advantageously a micro battery, and at least two feed points (A, B) of a system, involving the following steps:

placing the micro battery inside a cavity provided in a substrate, the walls whereof are covered, at least partially, in a metallic layer;

filling the cavity with a matrix which is solid at a first temperature and capable of softening due to the effect of a temperature increase;

if necessary, increasing the temperature until the matrix softens;

applying an external action to the micro battery in order to move it inside the matrix to a point A or B located in the metallized cavity of the substrate;

lowering the temperature until the matrix solidifies.

In this method, the matrix is advantageously made of a polymer and the temperature is increased to the glass transition temperature (Tg) and/or melting temperature (Tf) of said polymer. This polymer can be an ethylene and methyl acrylate copolymer or an ethylene and vinyl acetate copolymer.

Also, the substrate must have a softening temperature higher than that of the matrix, the difference between these two temperatures advantageously being equal to or greater than 50° C. or, even more advantageously, 70 to 100° C. Thus, the substrate is advantageously made of a plastic material, for example polyethylene naphthalate (PEN) or a polyimide-based material for PCBs.

The material pair polyethylene naphthalate for the substrate/ethylene and methyl acrylate copolymer for the matrix is perfectly suitable for the present application. In this case, the temperature of the system is raised to 75° C.

Such a system is advantageously sealed by bonding a film or plastic membrane that is used to block the cavity. In other words, the matrix and, if applicable, the substrate is/are covered or encapsulated by a layer.

An electric or magnetic action can be applied in order to displace the micro battery. Displacement of the micro battery is advantageously obtained in a horizontal plane by using a magnet. The face of the micro battery that faces the magnet is then covered in a magnetic coating.

The invention therefore relates to an electronic device comprising a micro battery placed in a cavity of a substrate, the walls of the cavity being covered, at least partially, in a conductive layer that makes it possible to establish different connection points (A, B). Thus, the battery is capable of alternatively powering devices connected by a connection line to points A and B.

According to another aspect, the invention relates to a method for producing a variable-capacitance transistor involving displacing the gate of the transistor (which then corresponds to the object) by using the method as claimed.

In other words, the invention relates to a method for producing a variable-capacitance transistor which involves the following steps:

placing the gate electrode inside a cavity provided in a substrate;

filling the cavity with a matrix which is solid at a first temperature and capable of softening due to the effect of a temperature increase;

if necessary, increasing the temperature until the matrix softens;

applying an external action to the gate so as to move it inside the softened matrix;

lowering the temperature until the matrix solidifies.

In the context of such a transistor, the object, in this case the gate electrode, is advantageously a sheet of iron or aluminum.

Such a transistor also has source and drain electrodes and a semiconductor material deposited on the surface of the substrate on the face opposite to that on which the gate is located.

The source and drain electrodes are, in a classic manner, made by metallization and are in the form of a gold coating which may be 30 nm thick for example. As in the case of the gate, the source and/or drain electrodes may also be displaced according to the invention so as to modify the dimensions of the channel of the transistor.

In this method, the matrix is advantageously made of a polymer and the temperature is increased to the glass transition temperature (Tg) and/or melting temperature (Tf) of said polymer. This polymer can be an ethylene and methyl acrylate copolymer or an ethylene and vinyl acetate copolymer.

Also, the substrate must have a softening temperature higher than that of the matrix, the difference between these two temperatures advantageously being equal to or greater than 50° C. or, even more advantageously, 70 to 100° C. Thus, the substrate is advantageously made of a plastic material, for example polyethylene naphthalate (PEN).

The material pair polyethylene naphthalate for the substrate/ethylene and methyl acrylate copolymer for the matrix is perfectly suitable for the present application. In this case, the temperature of the system is raised to 75° C.

Such a system is advantageously closed by bonding a membrane that is used to block the cavity. In other words, the matrix and, if applicable, the substrate is/are covered or encapsulated by a layer.

An electric or magnetic action can be applied in order to displace the gate. Displacement of the gate is advantageously obtained in a vertical plane by using a magnet. Nevertheless, it is possible to displace it in three directions. It is thus possible to alter the thickness of the dielectric or modify the distance between the gate and the source or drain electrode. This results in modified electrical performance, especially a change in the capacitance of the transistor.

The invention therefore also relates to an electrical device that corresponds to a transistor, the capacitance whereof is made variable by displacing the gate electrode and its relative position in the transistor. Similarly, one can produce variable resistances by displacing a conducting bar over an array of patterns in order to establish serial contact with a defined number of patterns, thus constituting a variable resistance.

The object can also be an optical element, the orientation whereof makes it possible to modify the characteristics of a beam of light. For instance, the element can be a mirror that deflects light at an angle relative to the direction of the light beam. It can be a filter used to attenuate, to a greater or lesser extent, the light intensity or in order to select or not select certain wavelengths.

According to another aspect, the invention therefore relates to a method for producing an adjustable optical device which involves the following steps:

depositing an optical element inside a cavity provided in a substrate;

filling the cavity with a matrix which is solid at a first temperature and capable of softening due to the effect of a temperature increase;

if necessary, increasing the temperature until the matrix softens;

applying an external action to the element so as to move it inside the matrix;

lowering the temperature until the matrix solidifies.

BRIEF DESCRIPTION OF THE DRAWINGS

The way in which the invention can be implemented and its resulting advantages will be made more readily understandable by the descriptions of the following embodiments, given merely by way of example and non limitatively, reference being made to the accompanying drawings:

FIG. 1 illustrates how the method according to the invention is used to produce a variable connection.

FIG. 2 illustrates how the method according to the invention is used to fabricate a variable-capacitance transistor.

DESCRIPTION OF THE PREFERRED EMBODIMENTS

Figure 3A:
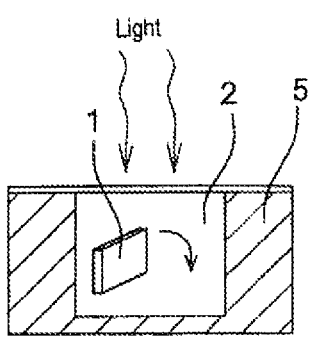
FIG. 3 illustrates an optical device that can be adjusted by using the method according to the invention with a first position (A) and a second position (B) of the optical element.
Figure 3B:
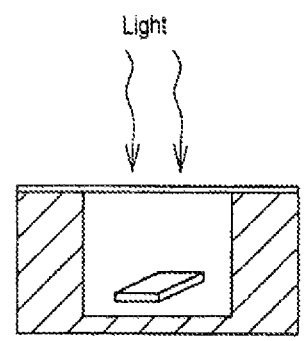

1/ Producing a Variable Connection:

This particular embodiment makes it possible, for example, to connect a micro battery alternatively to point A and to point B and is shown in FIG. 1.

Step I (FIGS. 1A and 1B):

The polyethylene naphthalate (Tg=120° C.) which is used as substrate (5) is embossed or etched to a thickness of 125 μm for example.

Cavity (4) which is thus obtained has variable dimensions depending on the displacement and size of the object (1) that is to be moved.

Step II (FIG. 1C):

If an electrical contact is to be established between substrate (5) and object (1), the edges of the cavity are metallized with the aid of a metallic layer (6) that ensures a connection line.

Step III (FIG. 1D):

The object (1) that is to be displaced is then inserted in cavity (4) provided for this purpose.

Step IV (FIG. 1E):

Cavity (4) is filled with a polymer having a low Tf/Tg which is used as matrix (2), in the liquid or solid state, so as to cover the object to be displaced (1). For example, the polymer is an ethylene and methyl acrylate copolymer that has a melting temperature of less than 70° C. In fact, it becomes liquid above 50° C.

Step V (FIG. 1F):

Cavity (4) is closed by another film or plastic membrane (7) by bonding so as to encapsulate and close the system.

Step VI (FIGS. 1G and 1H):

The temperature of the system is increased from ambient temperature to a temperature at which the polymer used as matrix (2) softens, in this case to a temperature of 75° C. which ensures that only the polymer changes from a solid state to a liquid state.

The temperature difference between the glass transition temperature (Tg) of the plastic (substrate, 5) and the melting temperature (Tf) of polymer (2) must be approximately 75° C. in order to ensure thermal stability of the system. A minimum temperature difference of 50° C. seems to be an acceptable value.

Step VII (FIGS. 1I and 1J):

A magnet (3) is used to displace object (1) in the liquid phase of polymer (2) from one connection point A to the other point B. To achieve this, the face of micro battery (1) is covered with a magnetic coating so that it can be magnetized.

Instead of using magnetism to displace the object, one can use other methods such as an electric field, dielectrophoresis, a mechanical action or gravity by positioning the system vertically.

2/ Fabricating a Variable-Capacitance Transistor:

This particular embodiment is used to fabricate a variable-capacitance organic field-effect transistor and is shown in FIG. 2.

The method according to the invention is used to displace the gate electrode in a molten polymer matrix. Thanks to the variable gate-oxide distance, it is possible to modify the capacitance of the transistor.

Step I (FIG. 2A):

A cavity (4) is embossed or etched in the polyethylene naphthalate which is used as substrate (5).

Step II (FIG. 2B):

Source and drain electrodes (9) are produced by metallization by depositing 30 nm of Au.

Step III (FIG. 2C):

The object (1) to be displaced, in this case a floating gate consisting of a sheet of iron, is inserted in cavity (4) provided for this purpose.

Step IV (FIG. 2D):

Cavity (4) is filled with polymer having a low Tf/Tg which is used as matrix (2), in the liquid or solid state, so as to cover the object to be displaced (1). For example, the polymer is an ethylene and methyl acrylate copolymer that has a melting temperature of less than 70° C. In fact, it becomes liquid above 50° C.

Step V (FIG. 2E):

Cavity (4) is closed with a membrane (7) so as to encapsulate and close the system.

Step VI (FIG. 2F):

The temperature of the system is increased from ambient temperature to a temperature at which the polymer used as matrix (2) softens, in this case to a temperature of 75° C. which ensures that only the polymer changes from a solid state to a liquid state.

Step VII (FIGS. 2G and 2H):

A semiconductor layer (8) is placed between the source and drain electrodes (6'). A magnet (3) is used to displace object (1) in the liquid phase of polymer (2). Displacement of the gate makes it possible to adjust the thickness of the dielectric in three dimensions. This results in modified electrical performance of the transistor in accordance with the following formula:

$$C_{ox} = \epsilon_r \epsilon_0 S/e$$

FIG. 2I is a top view of the system: Gate (1) can move in three dimensions in molten polymer (2).

The above description shows that the claimed method can be used in order to model the behavior of a transistor in three dimensions, either by moving the source or drain in order to understand the physics associated with the structure or, more generally, in order to study any type of phenomenon produced by modifying the positioning of the gate in the transistor structure.

One can, depending on the viscosity of the polymer, vary the displacement of the gate. In fact, the distance over which the embedded metal (1) is displaced depends on the viscosity of polymer (2) and the strength of magnet (3).

The invention claimed is:

1. A method for displacing an object in a solid system involving the following steps:
   providing a substrate having a cavity;
   placing the object and a matrix which is solid at a first temperature and capable
      of softening due to the effect of a temperature increase, in said cavity;
   if necessary, increasing the temperature until the matrix softens;
   applying an external action to the object so as to move it inside the matrix; and
   lowering the temperature until the matrix solidifies resulting in a solid system
      comprising said object and said substrate.

2. The method for displacing an object as claimed in claim 1, wherein said step of placing the object in and a matrix comprises the step of placing an object selected from the group consisting of silicon nano-wires, carbon nanotubes, micro battery, micro-cell, and connector.

3. The method for displacing an object as claimed in claim 1, wherein the matrix is made of a polymer and the temperature is increased to the glass transition temperature (Tg) and/or melting temperature (Tf) of said polymer.

4. The method for displacing an object as claimed in claim 3, wherein said step of placing the object and a matrix comprises the step of placing the object and a matrix comprising an ethylene and methyl acrylate copolymer or an ethylene and vinyl acetate copolymer.

5. The method for displacing an object as claimed in claim 1, wherein an electric or a magnetic action, is applied.

6. The method for displacing an object as claimed in claim 1, wherein said step of placing the object and a matrix comprises the step of placing the object and a matrix in a cavity of said substrate, said substrate having a softening temperature that is higher than that of the matrix.

7. The method for displacing an object as claimed in claim 1, wherein said step of providing a substrate having a cavity comprises the step of providing a plastic substrate having a cavity.

8. The method for displacing an object as claimed in claim 1, wherein the matrix is covered or encapsulated in a layer.

9. The method for displacing an object as claimed in claim 1, wherein the substrate is covered or encapsulated in a layer.

10. A method for establishing variable connections between an object, and at least two feed points of a system and involving the following steps:
   placing the object inside a cavity provided in a substrate, the walls whereof are covered, at least partially, in a metallic layer;
   filling the cavity with a matrix which is solid at a first temperature and capable of softening due to the effect of a temperature increase;
   if necessary, increasing the temperature until the matrix softens;
   applying an external action to the object in order to move it inside the matrix to a point located in the metallized cavity of the substrate wherein said object makes electrical connection with one of said at least two feed points; and
   lowering the temperature until the matrix solidifies.

11. The method for displacing an object as claimed in claim 5, wherein said magnetic action comprises a magnet.

12. The method for displacing an object as claimed in claim 6, wherein a difference between said softening temperature of said substrate and a softening temperature of said matrix is equal to or greater than 50° C.

13. The method for displacing an object as claimed in claim 7, wherein said plastic substrate comprises a polyethylene naphthalate (PEN) or polyimide.

14. The method for establishing variable connections between an object of claim 10, wherein said object comprises a micro battery.

\* \* \* \* \*